(12) United States Patent
Honda (10) Patent No.: US 12,388,443 B2
(45) Date of Patent: Aug. 12, 2025

(54) DRIVE VOLTAGE CONTROL DEVICE, DRIVE VOLTAGE CONTROL DEVICE FOR FAN MOTOR, AND IMAGE FORMING APPARATUS

(71) Applicant: Shuichi Honda, Kanagawa (JP)

(72) Inventor: Shuichi Honda, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 18/591,181

(22) Filed: Feb. 29, 2024

(65) Prior Publication Data
US 2024/0297648 A1     Sep. 5, 2024

(30) Foreign Application Priority Data

Mar. 2, 2023  (JP) ................................. 2023-032304
Dec. 21, 2023 (JP) ................................. 2023-215888

(51) Int. Cl.
| | |
|---|---|
| *H03K 17/68* | (2006.01) |
| *G03G 15/00* | (2006.01) |
| *H03K 17/567* | (2006.01) |
| *H03K 17/687* | (2006.01) |

(52) U.S. Cl.
CPC ......... *H03K 17/6871* (2013.01); *G03G 15/80* (2013.01); *H03K 17/567* (2013.01)

(58) Field of Classification Search
CPC ............. G03G 15/80; H03K 17/08122; H03K 17/102; H03K 17/567; H03K 17/6871
See application file for complete search history.

(56) References Cited

U.S. PATENT DOCUMENTS 6,256,215 B1 *  7/2001  Barrett ............... H03K 17/6871
                                                          307/77

FOREIGN PATENT DOCUMENTS

| JP | 2000-333487 A | 11/2000 |
|---|---|---|
| JP | 2002-199722 A | 7/2002 |
| JP | 2004-100493 A | 4/2004 |
| JP | 2007-093057 A | 4/2007 |

* cited by examiner

*Primary Examiner* — Sophia S Chen
(74) *Attorney, Agent, or Firm* — XSENSUS LLP (57) ABSTRACT

A drive voltage control device includes a first drive power source to supply a first drive voltage to a first driver and a second driver connected to the first driver in series; a second drive power source to supply a second drive voltage; a voltage dropper; a first switching circuit, a second switching circuit, a third switching circuit, a third switching circuit, and a fourth switching circuit. The first switching circuit includes a first switching element between the first drive power source and the voltage dropper on the drive voltage line, and first circuitry configured to switch the first switching element between ON and OFF. The second switching circuit includes a second switching element between the second drive power source and the voltage dropper on the drive voltage line; and second circuitry configured to switch the second switching element between ON and OFF.

7 Claims, 9 Drawing Sheets

FIG. 9

DRIVE VOLTAGE CONTROL DEVICE, DRIVE VOLTAGE CONTROL DEVICE FOR FAN MOTOR, AND IMAGE FORMING APPARATUS

CROSS-REFERENCE TO RELATED APPLICATIONS

This patent application is based on and claims priority pursuant to 35 U.S.C. § 119(a) to Japanese Patent Application No. 2023-032304, filed on Mar. 2, 2023 and Japanese Patent Application No. 2023-215888, filed on Dec. 21, 2023 in the Japan Patent Office, the entire disclosure of which is hereby incorporated by reference herein.

BACKGROUND

Technical Field

Embodiments of the present disclosure relate to a drive voltage control device, a drive voltage control device for a fan motor, and an image forming apparatus.

Related Art

In the case of operating multiple drive devices having different driving voltages, a technique of appropriately controlling a voltage to be supplied to each drive device by using a voltage variable direct current (DC) power supply circuit or using a voltage-dropping element for a power supply voltage in accordance with the driving voltage of the drive device to be operated has been considered. To avoid an increase in the number of components and associated costs that result from using voltage-dropping elements or voltage conversion circuits for each drive device with different rated voltages, different from the direct current (DC) power source's output voltage, a technology has been disclosed that employs a variable voltage DC power supply circuit that can adjust its voltage output according to the rated voltage of the drive device in operation.

However, employing such a variable voltage DC power supply circuit, which adjusts the drive voltage to match each drive device, fails to simultaneously operate drive devices having different drive voltages. Further, the approach involving voltage-dropping elements requires the installation of a separate voltage-dropping element for each drive voltage having a different drive voltage, potentially leading to an increased number of voltage-dropping elements as more drive devices are utilized. The above technology necessitates prohibiting the operation of all or part of the drive devices that require a drive voltage different from the one being applied. This technology is unable to simultaneously operate multiple drive devices that have different drive voltages.

SUMMARY

An embodiment of the present disclosure provides a drive voltage control device includes a first drive power source to supply a first drive voltage to a first driver and a second driver connected to the first driver in series; a second drive power source to supply a second drive voltage to the first driver and the second driver; a voltage dropper connected in parallel with the first driver and the second driver and on a drive voltage line between the first drive power source and the second drive power source; a first switching circuit, a second switching circuit, a third switching circuit, a third switching circuit, and a fourth switching circuit. The first switching circuit includes a first switching element between the first drive power source and the voltage dropper on the drive voltage line, and first circuitry configured to switch the first switching element between ON and OFF. The second switching circuit includes a second switching element between the second drive power source and the voltage dropper on the drive voltage line; and second circuitry configured to switch the second switching element between ON and OFF. The third switching circuit includes a third switching element between the first drive power source and the first driver; and third circuitry configured to switch the third switching element between ON and OFF. The fourth switching circuit includes a fourth switching element between the first drive power source and the second driver; and fourth circuitry configured to switch the fourth switching element between ON and OFF.

An embodiment of the present disclosure provides a drive voltage control circuit coupled to a fan motor including the drive voltage control device.

An embodiment of the present disclosure provides image forming apparatus comprising the drive voltage control circuit.

BRIEF DESCRIPTION OF THE DRAWINGS

A more complete appreciation of the disclosure and many of the attendant advantages and features thereof can be readily obtained and understood from the following detailed description with reference to the accompanying drawings, wherein:

FIG. 9 is a diagram of an image forming apparatus serving as an electronic device according to the first to third embodiments.

The accompanying drawings are intended to depict embodiments of the present invention and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Referring now to the drawings, embodiments of the present disclosure are described below. As used herein, the singular forms "a," "an," and "the" are intended to include the plural forms as well, unless the context clearly indicates otherwise.

According to one aspect of the present disclosure, the drive voltage can be switched in any desired manner with fewer voltage-dropping elements than before during the operation of multiple drive devices.

A drive voltage control device, a drive voltage control device for a fan motor, and an image forming apparatus are described in detail with reference to the accompanying drawings.

Initially with reference to FIGS. 1 to 9C, a description is given of a first embodiment of the present disclosure.

Figure 1:
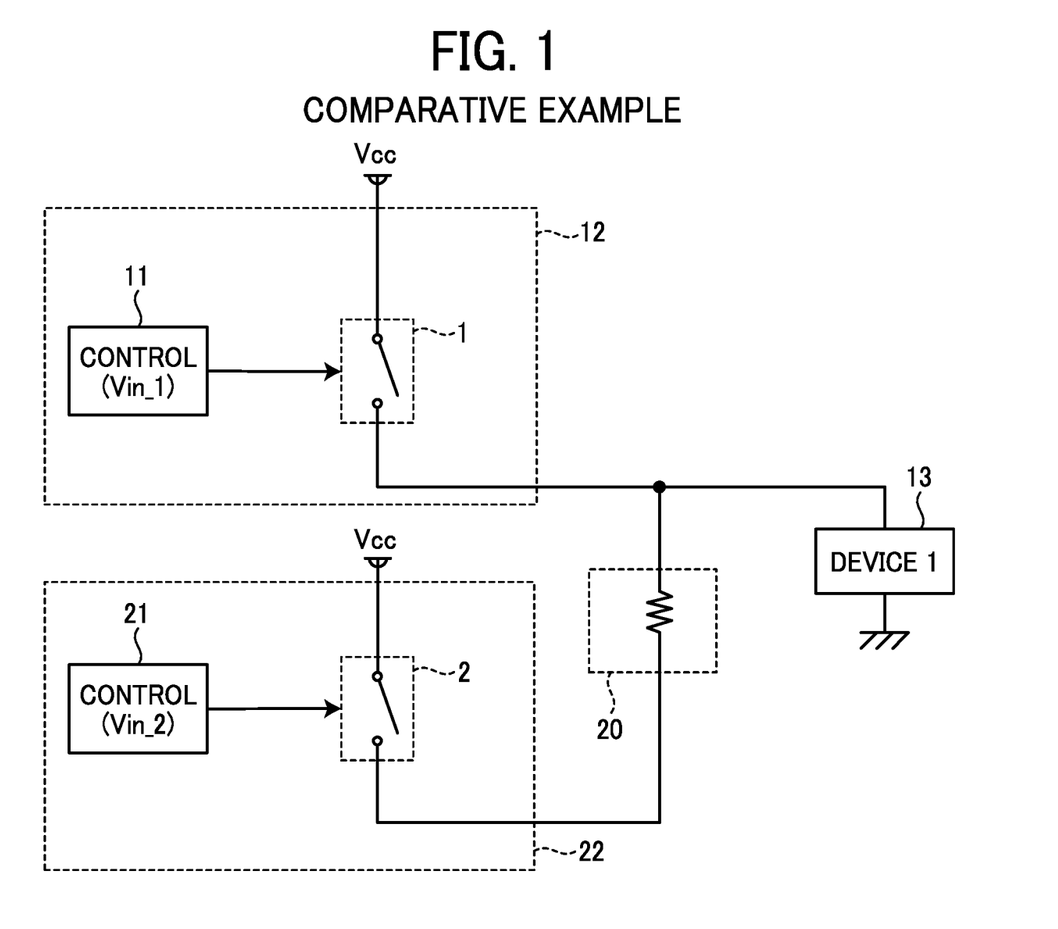
FIG. 1 is a circuit diagram of the configuration of a drive voltage control circuit according to a comparative example.

FIG. 1 is a circuit diagram of the configuration of a drive voltage control circuit according to a comparative example. One method for controlling voltage applied to a drive device 13 (or a driver) includes placing a voltage-dropping element 20 (or a voltage dropper) between a drive power source Vcc and the drive device 13. This allows for a drive voltage control circuit that enables the application of a drive voltage (or lower power) lower than the maximum drive voltage (or full power).

The drive voltage control circuit includes the voltage-dropping element 20. The control elements 11 and 21 included in the switching circuits 12 and 22 controls the switching elements 1 and 2 to switch between ON and OFF to adjust the drive voltage applied to the drive device 13.

When the switching circuit 12 alone is turned on, the maximum drive voltage is applied to the drive device 13, and the drive device 13 operates at full power (e.g., 24 voltage (V)). When the switching circuit 22 alone is turned on, the drive voltage applied to the drive device 13 is lowered by the voltage-dropping element 20, and the drive device 13 operates at low power (e.g., 12V).

In the drive voltage control circuit according to the comparative example, two switching circuits 12 and 22 and one voltage-dropping element 20 are used for one drive device 13. In such a configuration, two switching circuits and two voltage-dropping elements 20 are used for operating two drive devices 13. This means that, with more drive device 13 used, the number of voltage-dropping elements 20 used increases, resulting in higher costs.

Figure 2:
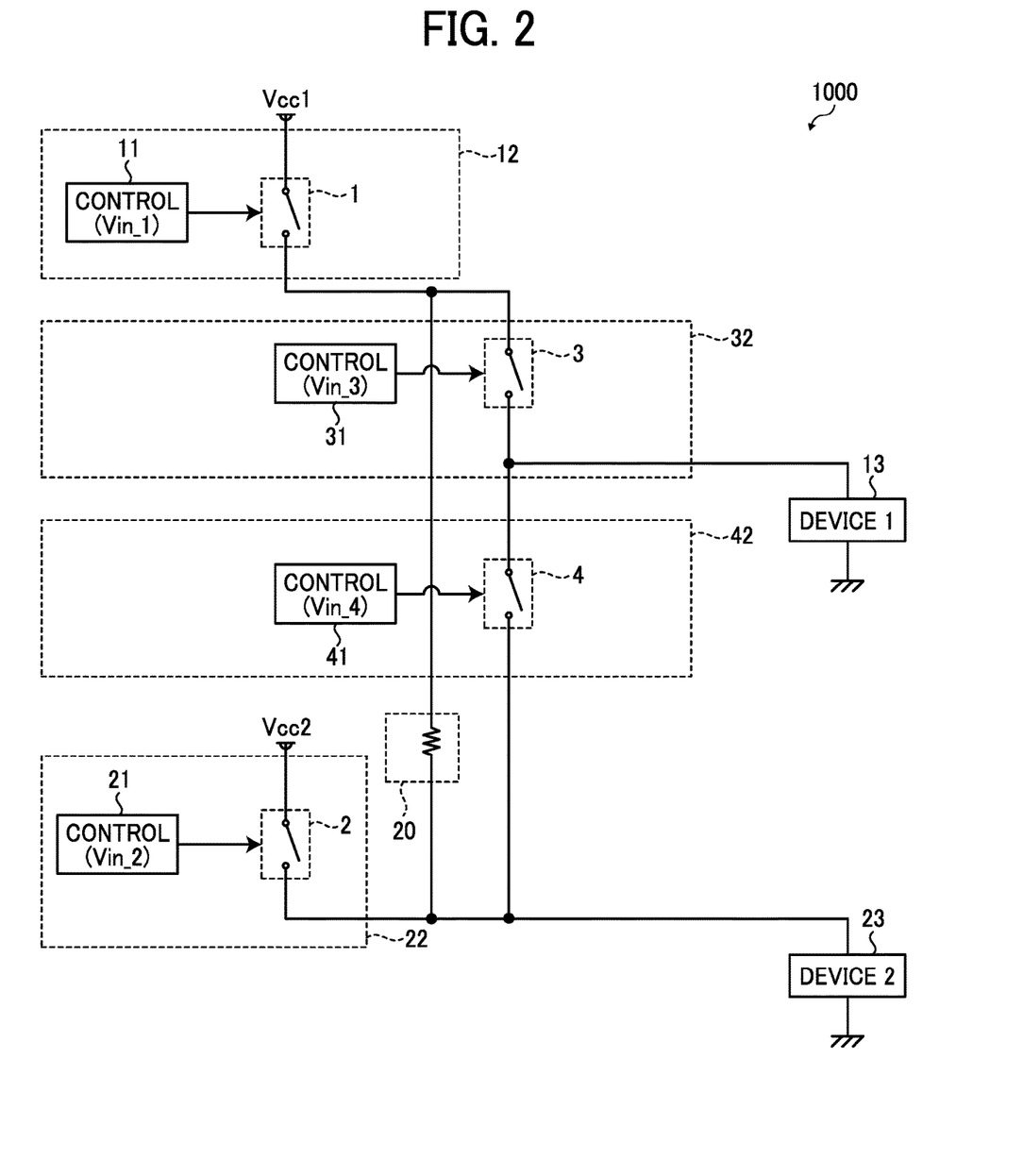
FIG. 2 is a circuit diagram of the configuration of a drive voltage control circuit according to a first embodiment of the present disclosure.

FIG. 2 is a circuit diagram of the configuration of a drive voltage control circuit 1000 according to a first embodiment of the present disclosure. The drive voltage control circuit 1000 according to the present embodiment includes a voltage-dropping element 20 and first to fourth switching circuits 12, 22, 32, and 42. The drive voltage control circuit serves as a drive voltage control device. The drive voltage control circuit 1000 controls first to fourth switching elements 1, 2, 3, and 4 by the first to fourth control elements 11, 21, 31, and 41 (or first to fourth controllers) included in the first to fourth switching circuits 12, 22, 32, and 42, respectively, to control drive voltages applied to a first drive device 13 (or a first driver) and a second drive device 23 (or a second driver).

In the present embodiment, two drive devices are used. In the drive voltage control circuit 1000 according to the present embodiment, the voltage dropping device 20 is disposed on drive power lines between the first drive power source Vcc1 and the first drive device 13 to be controlled and between the second drive power source Vcc2 and the second drive device 23 to be controlled. A second switching circuit 32, which changes the drive voltage, is positioned preceding the first drive device 13 to switch the third switching element 3 ON and OFF. A third switching circuit 42, which switches the drive voltage, is positioned preceding the second drive device 23 to switch the fourth switching element 4 ON and OFF.

More specifically, the drive voltage control circuit 1000 includes the first drive power source Vcc1, the second drive power source Vcc2, the voltage-dropping element 20, and the first to fourth switching circuits 12, 22, 32, and 42. The first drive power source Vcc1 supplies drive power to the first drive device 13 and the second drive device 23, which are connected in series. The second drive power source Vcc2 supplies drive power to the first drive device 13 and the second drive device 23. The voltage-dropping element 20 is on the drive power line between the first drive power source Vcc1 and the second drive power source Vcc2 and is connected in parallel with the first drive device 13 and the second drive device 23.

The first switching circuit 12 includes a first switching element 1 and a first control element 11. The first switching element 1 is on the drive power line between the first drive power source Vcc1 and the voltage-dropping element 20 and changes drive voltage supplied to the first drive device 13 and the second drive device 23. The first control element 11 controls the first switching element 1 to switch between ON and OFF.

The second switching circuit 22 includes the second switching element 2 and the second control element 21. The second switching element 2 is disposed on the drive power line between the second drive power supply Vcc2 and the voltage dropping device 20 and changes the drive voltage supplied to the first drive device 13 and the second drive device 23. The second control element 21 controls the second switching element 2 to switch between ON and OFF.

The third switching circuit 32 includes the third switching element 3 and the third control element 31. The third switching element 3 is between the first drive power source Vcc1 and the first drive device 13 and is connected in parallel with the voltage-dropping element 20. The third switching element 3 switches the drive voltage supplied to the first drive device 13 and the second drive device 23. The third control element 31 controls the second switching element 3 to switch between ON and OFF.

The fourth switching circuit 42 includes the fourth switching element 4 and the fourth control element 41. The fourth switching element 4 is between the first drive power source Vcc2 and the second drive device 23 and is connected in parallel with the voltage-dropping element 20. The fourth switching element 4 switches the drive voltage supplied to the first drive device 13 and the second drive device 23. The fourth control element 41 controls the fourth switching element 4 to switch between ON and OFF.

The configuration of the present embodiment enables a single voltage-dropping element 20 to control or switch between full power and low power for both the drive voltage supplied to the first drive device 13 and the second drive device 23. This configuration further enables different drive voltages to be applied simultaneously to the first drive device 13 and the second drive device 23. Further, the configuration of the present embodiment enables more objects to be controlled by combining the voltage-dropping element 20 with the third switching circuit 32 and the fourth switching circuit 42 of the present embodiment. Thus, the drive voltages applied to the drive devices, which have multiple different drive voltages, can be controlled in any desired manner with a reduced number of voltage-dropping elements 20. This allows for a reduction in the cost increase that would occur when the number of drive devices is increased.

The drive voltage control circuit 1000 according to the present embodiment can be used in a drive voltage control device for a fan motor. A drive voltage control device for a fan motor, incorporating the drive voltage control circuit according to the present embodiment, achieves switching between full speed and low speed for the fan by controlling its drive voltage. The drive voltage control circuit 1000 according to the present embodiment can be used in an image forming apparatus. An image forming apparatus incorporating the drive voltage control circuit according to the present embodiment achieves multiple output operations with a single drive device by switching the drive voltage.

The drive voltage applied to the first drive device 13 and the second drive device 23 can be switched using a combination of ON and OFF of the first to fourth switching circuits 12, 22, 32, and 42 as illustrated in FIG. 2. Table 1 presents the output patterns for the drive voltage that can be controlled by the combinations of controls for the first to fourth switching elements 1, 2, 3, and 4. In Table, SW1, SW2, SW3, and SW4 indicate the first to fourth switching elements 1, 2, 3, and 4, respectively.

TABLE 1

|  | SW1 | SW2 | SW3 | SW4 | DEVICE 1 | DEVICE 2 |
|---|---|---|---|---|---|---|
| PATTERN 1 | ON | OFF | OFF | ON | LOW POWER DRIVE | LOW POWER DRIVE |
| PATTERN 2 | ON | OFF | ON | OFF | FULL POWER DRIVE | LOW POWER DRIVE |
| PATTERN 3 | ON | ON | ON | OFF | FULL POWER DRIVE | FULL POWER DRIVE |
| PATTERN 4 | OFF | ON | ON | OFF | LOW POWER DRIVE | FULL POWER DRIVE |

In a comparative example, a single drive voltage control circuit could previously only drive devices with the same drive voltage simultaneously, making Patterns 1 and 3 in Table 1 feasible. However, to implement Patterns 2 and 4, it was needed to either use more drive voltage control circuits, each including a voltage-dropping element 20, or prohibit the operation of all or part of drive devices that involve different drive voltages.

In contrast, the drive voltage control circuit 1000 of the present embodiment enables the simultaneous application of the appropriate drive voltages to the first drive device 13 and the second drive device 23, each involving different drive voltages, by controlling the first to fourth switching elements 1 to 4 according to Patters presented in Table 1. In other words, the first to fourth switching circuits 12, 22, 32, and 42 supplies multiple drive voltages to both the first drive device 13 and the second drive device 23 by switching the first to fourth switching elements 1 to 4 between ON and OFF using multiple Patterns of ON and OFF combinations, which are controlled by the first to fourth control elements 11, 21, 31, and 41.

Further, in the drive voltage control circuit of the present embodiment, the timing of switching between ON and OFF for the switching elements is staggered when either of the first drive device 13 and the second drive device 23, which are operating in any of the patterns in Table 1, transitions to another pattern. In other words, the first to fourth switching elements 1 to 4 stagger the timing of switching between ON and OFF with respect to each other. This prevents malfunctions caused by voltage spiking, where unintended drive voltages are applied to the drive devices at unintended timings.

For example, when transiting from Pattern 1 to Pattern 2, if SW3 (i.e., the third switching element 3) and SW4 (i.e., the fourth switching element 4) turn ON simultaneously, an unintended drive voltage output pattern, e.g., all the switching elements are ON, might occur. To prevent the occurrence of unintended drive voltage output patterns, all the switching elements are first turned off before switching to Pattern 2.

Figure 3:
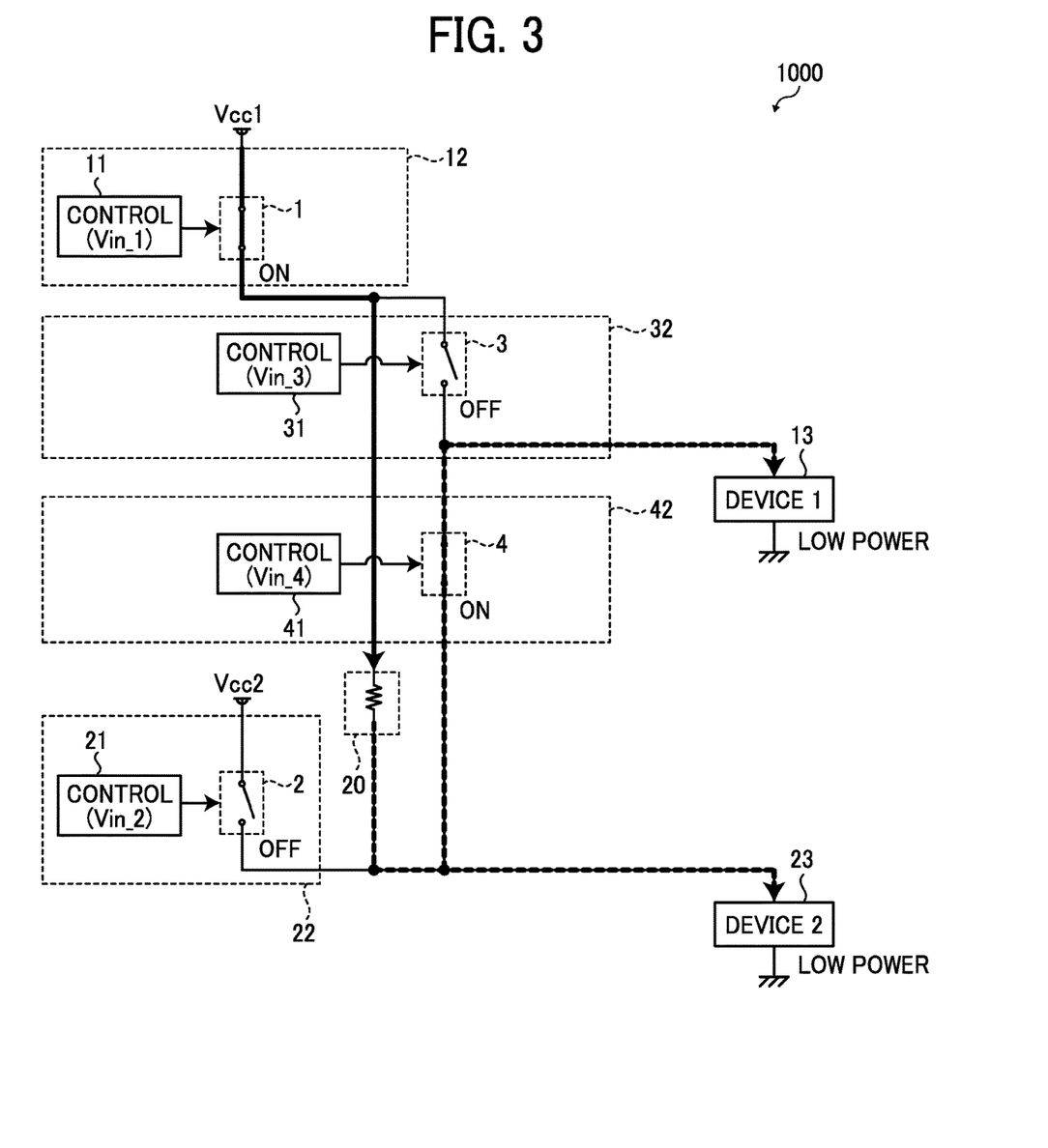
FIG. 3 is a diagram illustrating control processing of a drive voltage in pattern 1 in the drive voltage control circuit in FIG. 2, according to an embodiment of the present disclosure.

FIG. 3 is a diagram illustrating the control processing of a drive voltage in pattern 1 in the drive voltage control circuit 1000 of the first embodiment in FIG. 2, according to an embodiment of the present disclosure. In Pattern 1, as illustrated in FIG. 3, the drive voltage control circuit 1000 applies low-power drive voltages to the first drive device 13 and the second drive device 23 by turning on SW1 (i.e., the first switching element) and SW4 and turning off SW2 and SW3.

Figure 4:
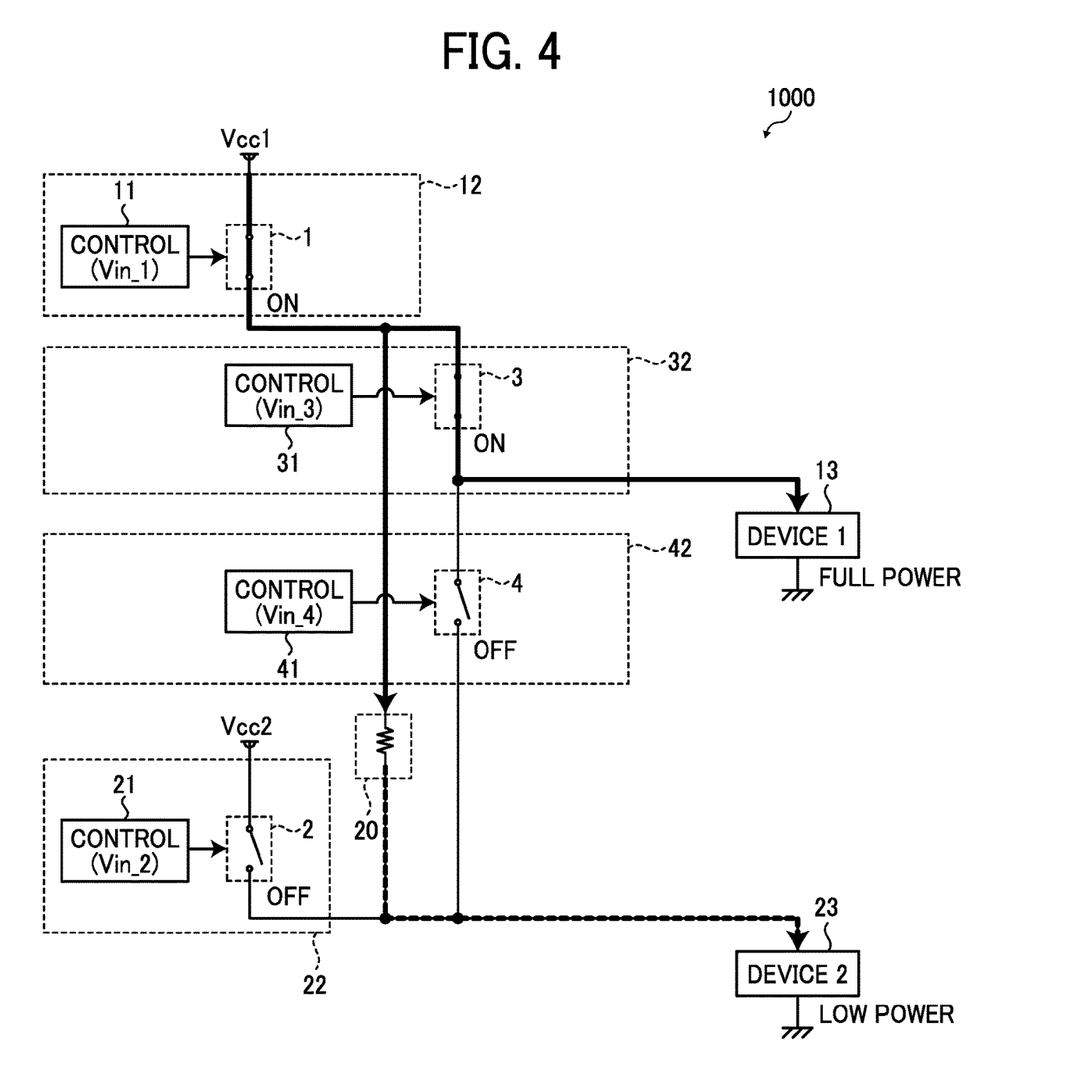
FIG. 4 is a diagram illustrating control processing of a drive voltage in pattern 2 in the drive voltage control circuit in FIG. 2, according to an embodiment of the present disclosure.

FIG. 4 is a diagram illustrating the control processing of a drive voltage in pattern 2 in the drive voltage control circuit 1000 of the first embodiment in FIG. 2, according to an embodiment of the present disclosure. In Pattern 2, as illustrated in FIG. 4, the drive voltage control circuit 1000 applies a full-power drive voltage to the first drive device 13 and a low-power drive voltage to the second drive device 23 by turning on SW1 and SW3 and turning off SW2 and SW4.

Figure 5:
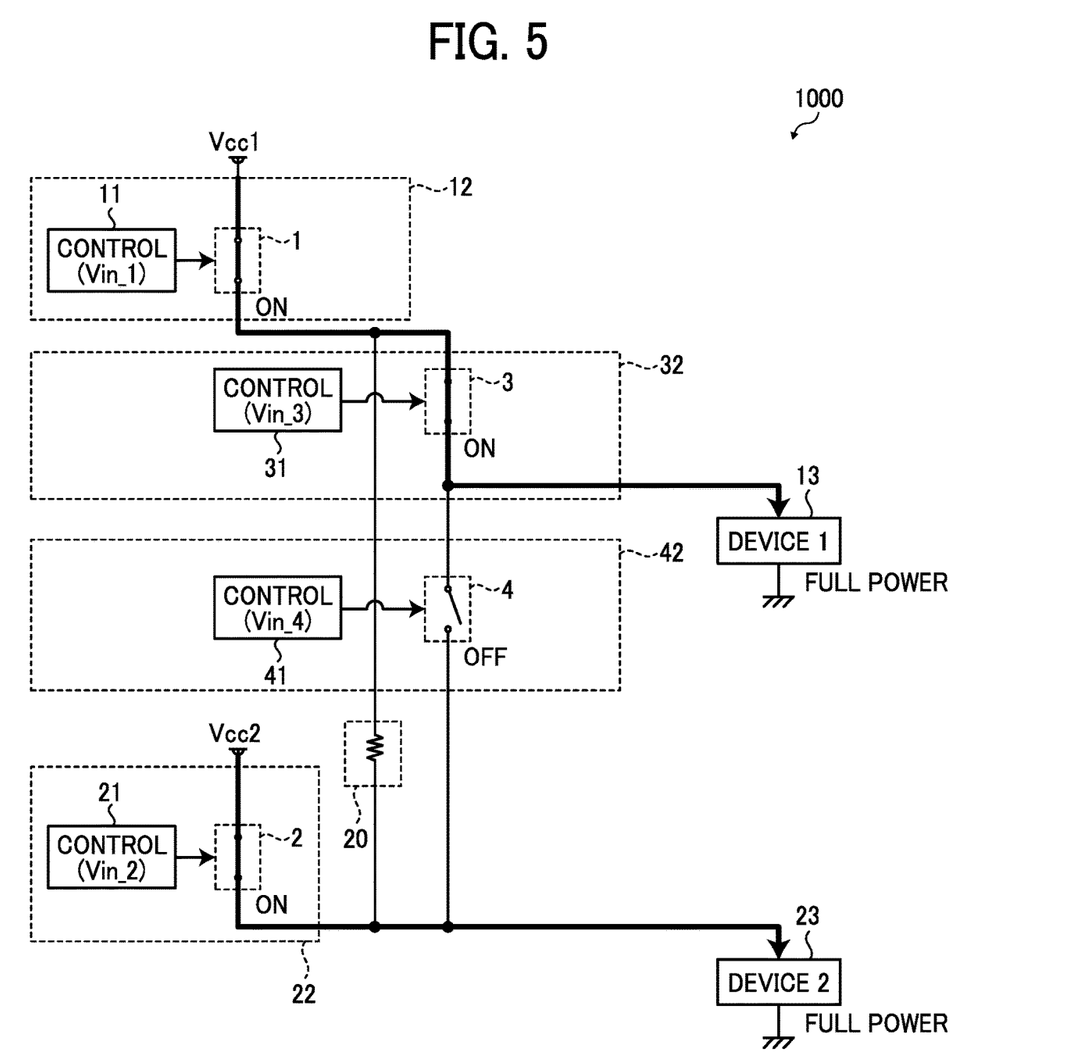
FIG. 5 is a diagram illustrating control processing of a drive voltage in pattern 3 in the drive voltage control circuit in FIG. 2, according to an embodiment of the present disclosure.

FIG. 5 is a diagram illustrating the control processing of a drive voltage in pattern 3 in the drive voltage control circuit 1000 of the first embodiment in FIG. 2, according to an embodiment of the present disclosure. In Pattern 3, as illustrated in FIG. 5, the drive voltage control circuit 1000 applies full-power drive voltages to the first drive device 13 and the second drive device 23 by turning on SW1, SW2, and SW3 and turning off SW4.

Figure 6:
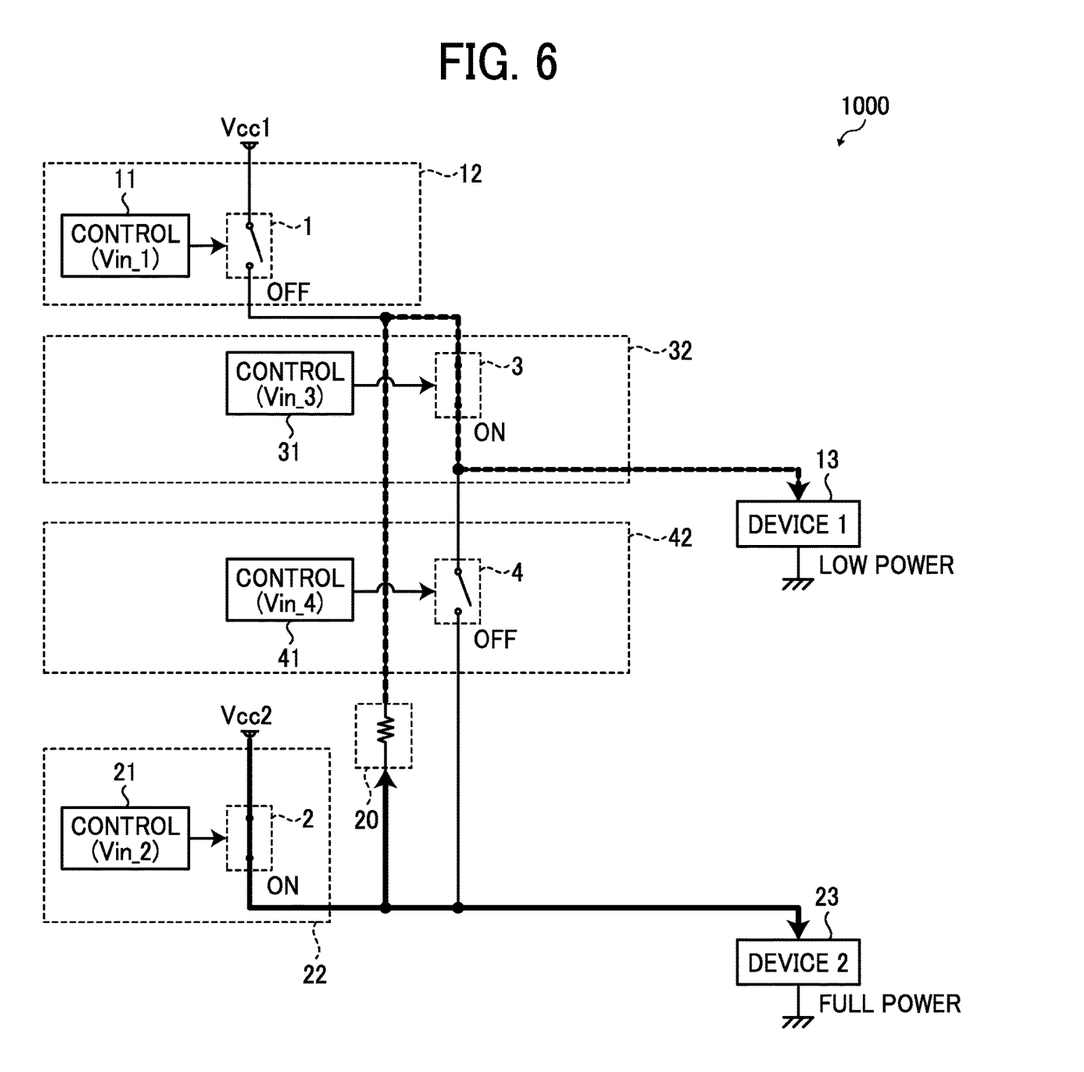
FIG. 6 is a diagram illustrating control processing of a drive voltage in pattern 4 in the drive voltage control circuit in FIG. 2, according to an embodiment of the present disclosure.

FIG. 6 is a diagram illustrating the control processing of a drive voltage in pattern 4 in the drive voltage control circuit 1000 of the first embodiment in FIG. 2, according to an embodiment of the present disclosure. In Pattern 4, as illustrated in FIG. 6, the drive voltage control circuit 1000 applies a low-power drive voltage to the first drive device 13 and a full-power drive voltage to the second drive device 23 by turning on SW2 and SW3 and turning off SW1 and SW4.

Thus, according to the drive voltage control circuit 1000 of the first embodiment, the drive voltages applied to the drive devices 13 and 23, which have multiple different drive voltages, are controlled in any desired manner with a reduced number of voltage-dropping elements 20. This allows for a reduction in the cost increase that would occur when the number of drive devices is increased.

Second Embodiment

Figure 7:
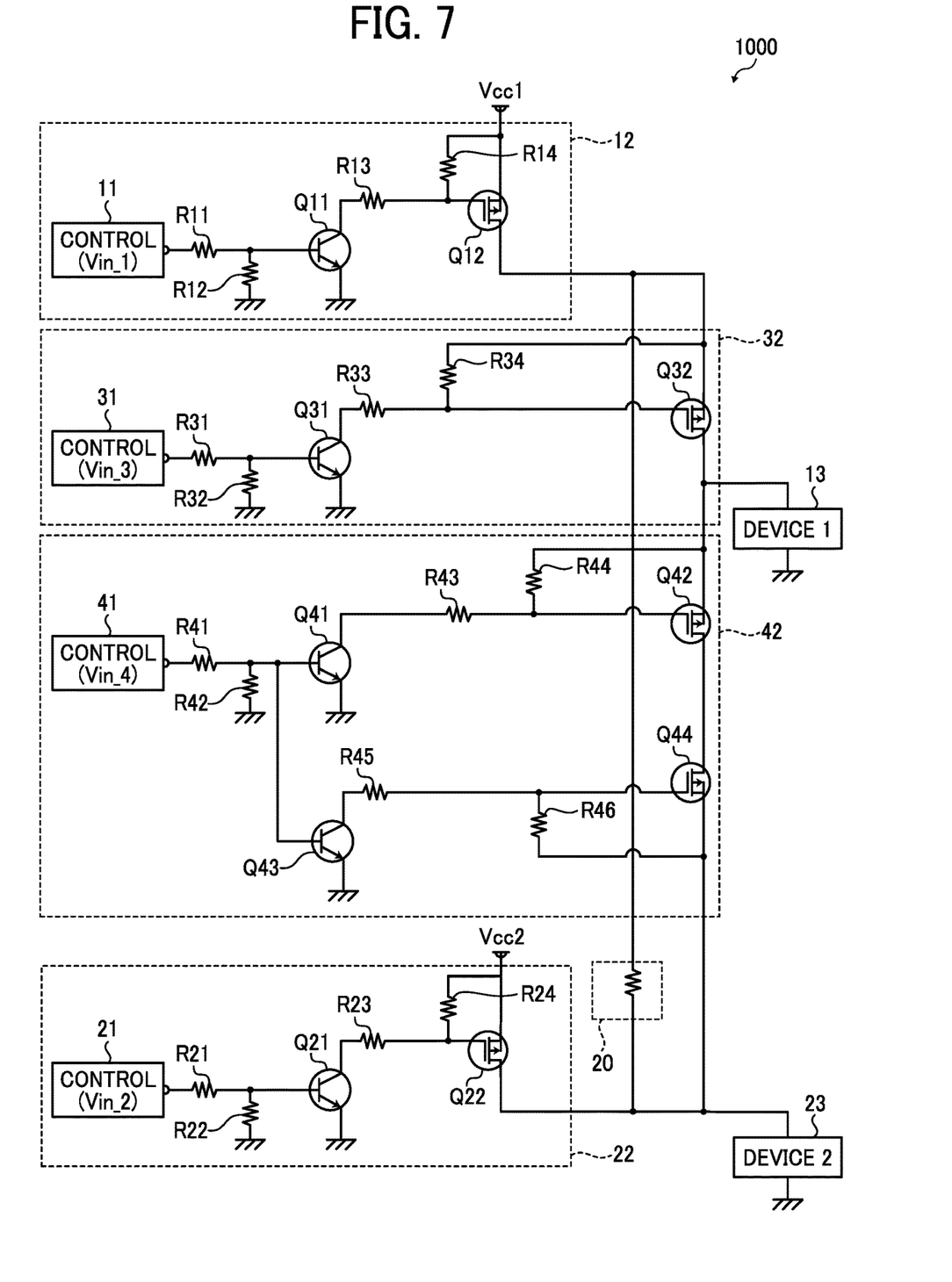
FIG. 7 is a circuit diagram of the configuration of a drive voltage control circuit according to a second embodiment of the present disclosure.

The present embodiment, the first to fourth switching elements of the switching circuit included in the drive voltage control circuit 1000 include field-effect transistors and resistors between gates and sources of the field-effect transistors (i.e., gate-source resistors of the field-effect transistors). A redundant description of like configurations of the embodiments described above is herein omitted.

FIG. 7 is a circuit diagram of the configuration of a drive voltage control circuit 1000 according to a second embodiment of the present disclosure. The drive voltage control circuit 1000 according to the present embodiment uses field-effect transistors Q12, Q22, Q32, Q42, and Q44 and resistors R14, R24, R34, R44, and R46 between the gates and sources of the field-effect transistors Q12, Q22, Q32, Q42, and Q44 in the switching elements of the first to fourth switching circuits 12, 22, 32, and 42, respectively. In the present embodiment, assuming that the load current flowing through the first drive device 13 and the second drive devices 23 is large, the switching elements are configured by Darlington connection of bipolar transistors Q11, Q21, Q31, Q41, and Q43 and the field-effect transistors (MOSFETs) Q12, Q22, Q32, Q42, and Q44. The resistors R11, R21, R31, and R41 are base resistors for the bipolar transistors Q11, Q21, Q31, Q41, and Q43. The resistors R12, R22, R32, and R42 are base-emitter resistors of the bipolar transistors Q11, Q21, Q31, Q41, and Q43. The resistors R13, R23, R33, R43, and R45 are gate resistors of the field effect transistors Q12, Q22, Q32, Q42, and Q44.

Receiving outputs from the first to fourth control elements 11, 21, 31, and 41, the bipolar transistors Q11, Q21, Q31, Q41, and Q43 are controlled to switch ON and OFF, enabling the switching of ON and OFF states of the subsequent field-effect transistors Q12, Q22, Q32, Q42, and Q44 and allowing for the switching of the drive voltage patterns.

In the present embodiment, assuming it is assumed that commonly used components with built-in body diodes are used for the field-effect transistors Q12, Q22, Q32, Q42, and Q44. To block signals that might unintentionally flow through the built-in diodes of the field-effect transistors Q12, Q22, Q32, Q42, and Q44, identical field-effect transistors are arranged such that their built-in diodes are oriented in opposite directions.

In addition, such an arrangement is achieved by using bipolar transistors with low ON resistance in place of the field-effect transistors Q12, Q22, Q32, Q42, and Q44, or by using switching ICs.

As described above, according to the drive voltage control circuit 1000 of the second embodiment, the drive voltage control circuit 1000 is configured by a discrete circuit using the transistors, and thus the drive voltage control circuit 1000 having similar characteristics as those of the drive voltage control circuit 1000 of the first embodiment is achieved at a lower cost.

Third Embodiment

Figure 8:
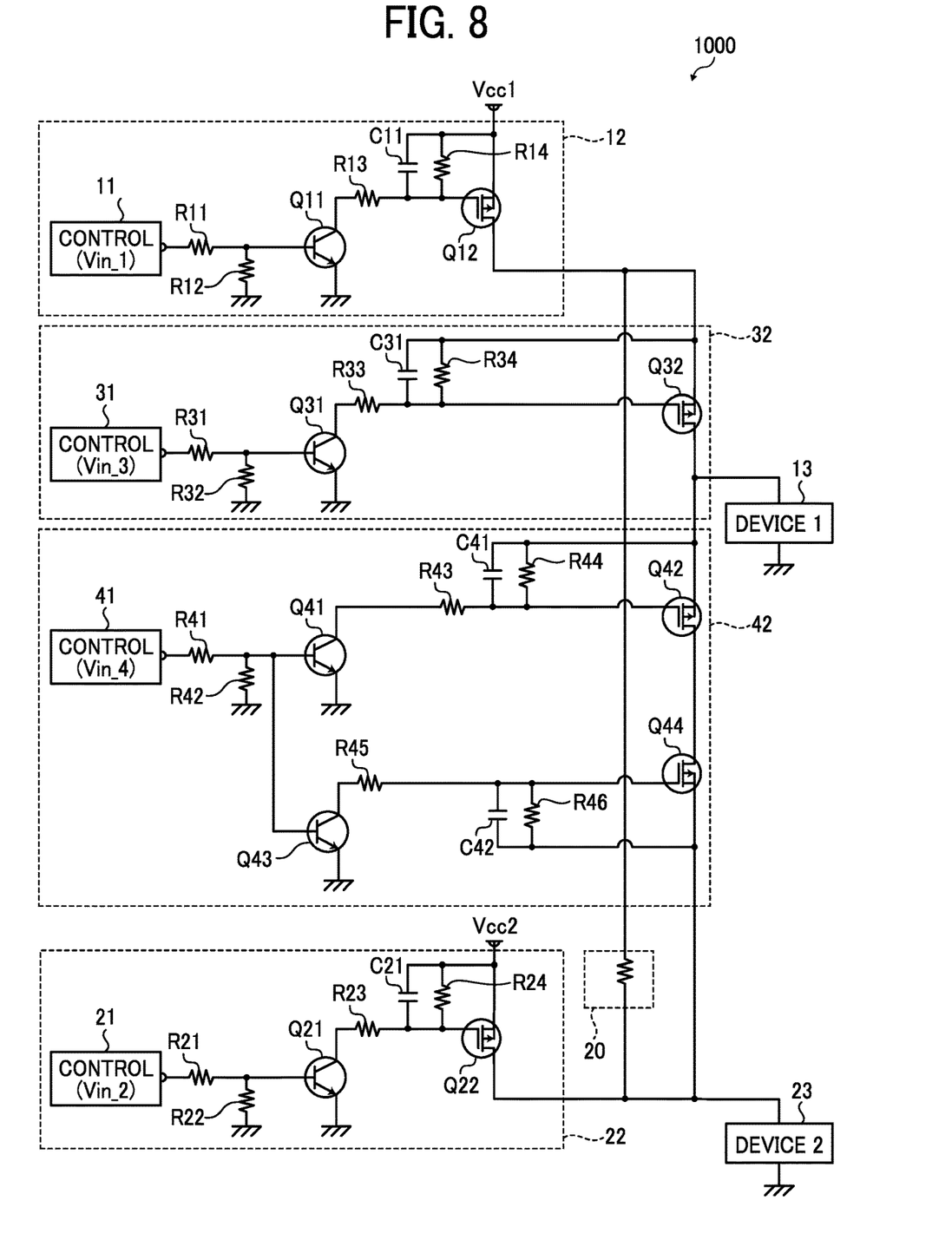
FIG. 8 is a circuit diagram of the configuration of a drive voltage control circuit according to a third embodiment of the present disclosure.

In the present embodiment, the first to fourth switching circuits of the drive voltage control circuit 1000 include capacitors connected in parallel to gate-source resistances of the field-effect transistors. A redundant description of like configurations of the embodiments described above is herein omitted.

FIG. 8 is a circuit diagram of the configuration of a drive voltage control circuit 1000 according to a third embodiment of the present disclosure. The drive voltage control circuit 1000, as illustrated in FIG. 8, when using field-effect transistors Q12, Q22, Q32, Q42, Q44, arranges capacitors C11, C21, C31, C41, and C42 in parallel with the gate-source resistances R14, R24, R34, R44, and R46 of these field-effect transistors Q12, Q22, Q32, Q42, and Q44.

As described above, the drive voltage control circuit 1000 according to the third embodiment can make the rise of switching gradual, allowing for a reduction in inrush currents that occur during switching.

Figure 9:
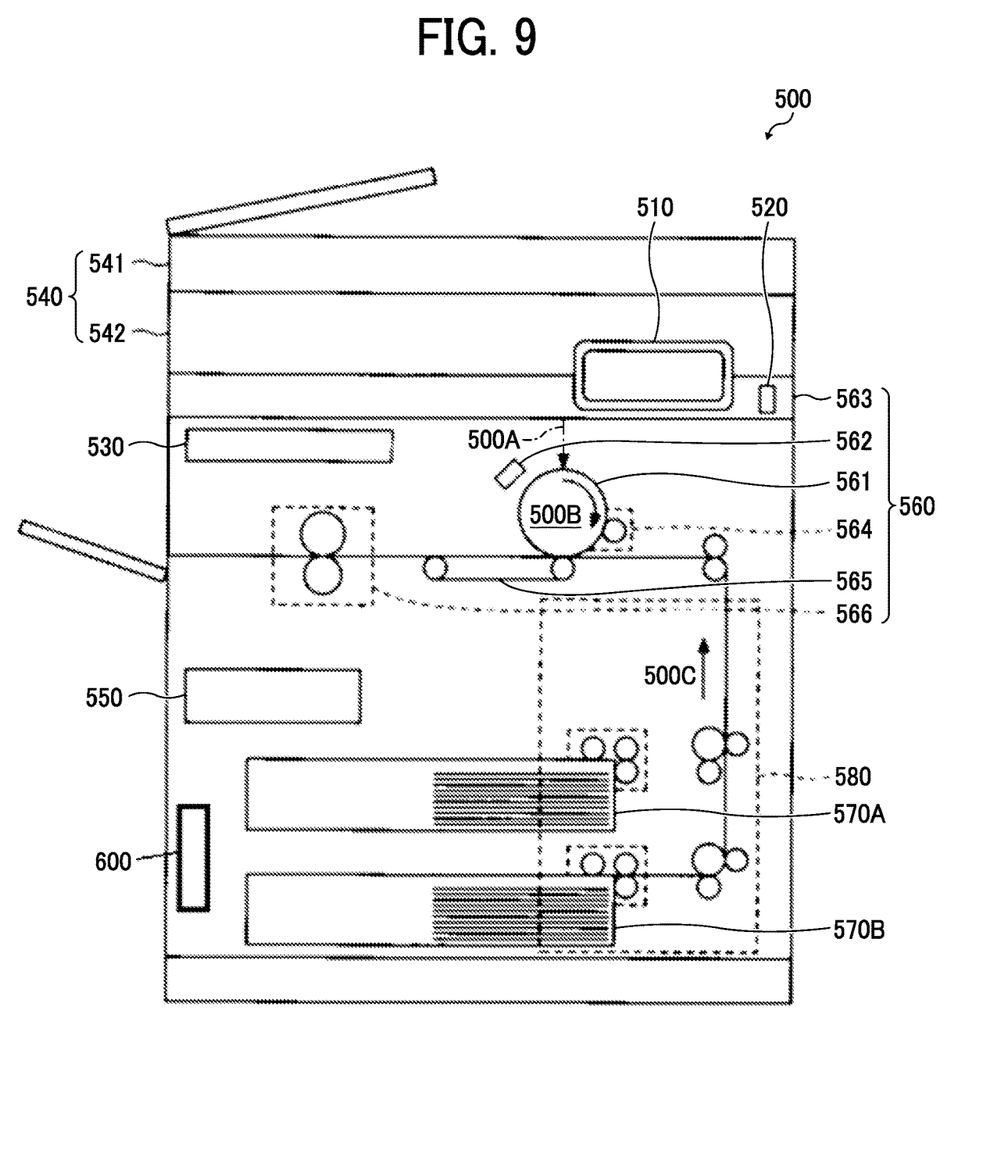
FIG. 9 is a diagram of an image forming apparatus that incorporate a drive voltage control circuit according to an embodiment of the present disclosure.

FIG. 9 is a diagram of an image forming apparatus 500 serving as an electronic device according to the first to third embodiments. The image forming apparatus 500 includes a fan motor 600.

The image forming apparatus 500 is a multifunction peripheral called a multi functional peripheral/printer (MFP). The image forming apparatus 500 has at least two of multiple functions such as a copy function, a facsimile (FAX) function, a print function, a scanner function, storage and delivery functions of input images (e.g., images scanned using a scanner function, or input through a printer function or a fax function).

Further, the image forming apparatus 500 is communicably connected to an external device such as a personal computer (PC) to operate in response to instructions received from the external device. In the present embodiment, the "image" processed by the image forming apparatus 500 includes, in addition to image data, data without image data, that is, data including only text information.

The image forming apparatus 500 is an electrophotographic type. As a charged surface of a photoconductor drum 561 is selectively exposed, an electrostatic latent image is written on the surface of the photoconductor drum 561. Toner adheres to the electrostatic latent image, thereby forming a toner image on the photoconductor drum 561. The toner image is transferred from the photoconductor drum 561 to a recording medium such as a paper sheet.

The image forming apparatus 500 includes a control panel 510, a startup switch 520, a controller 530, an image scanner 540, an engine control unit 550, a printer unit 560, sheet trays 570A and 570B, and a conveyance unit 580.

The control panel 510 receives various types of input according to the user's operation and displays various types of information (for example, information indicating the received operation, information indicating the operating state of the image forming apparatus 500, and information indicating the setting status of the image forming apparatus 500). In the present example, the control panel 510 is a liquid crystal display (LCD) having a touch panel function. However, the control panel 510 is not limited to such an LCD.

For another example, the control panel 510 may include an organic electroluminescence (EL) display functioning as the touch panel. In addition to or instead of the above-described control panel 510, an operation device such as a hardware key or a display device such as a lamp may be provided.

As a user presses the startup switch 520 when the image forming apparatus 500 is off, the image forming apparatus 500 boots up. When the image forming apparatus 500 is powered on, pressing the startup switch 520 by a user will turn off the image forming apparatus. As described above, the image forming apparatus 500 is turned on/off, but not limited to, by pressing the startup switch 520. Alternatively, the image forming apparatus 500 may be turned on/off based on an instruction received from an external device.

The controller 530 comprehensively controls the image forming apparatus 500 based on operational inputs from the control panel 510. As an example, the controller 530 causes the image forming apparatus 500 to execute an operation corresponding to an input or information received by the control panel 510. As another example, the controller 530 causes the image forming apparatus 500 to execute an instruction received from an external device such as a PC. In addition, as other examples, the image forming apparatus 500 performs predetermined operations when specific conditions are detected, such as detecting the pressing of the startup switch 520, or detecting an anomaly that has occurred in the image forming apparatus 500.

A specific example of the controller 530 is a control board on which a circuit for controlling the image forming apparatus 500 is mounted. A circuit that comprehensively controls the image forming apparatus 500 is equipped with a Central Processing Unit (CPU), Read Only Memory (ROM), and Random Access Memory (RAM) according to an embodiment of the present disclosure. The controller 530 controls the image forming apparatus 500 by executing programs stored in the ROM and Hard Disk Drive (HDD), with the CPU using the RAM as a workspace.

The image scanner 540 reads a document. The image scanner 540 includes an auto document feeder (ADF) 541 and a scanner unit 542. The ADF 541 sequentially conveys documents placed on the ADF 541 and optically reads the documents to generate an image. The scanner unit 542 optically scans the document placed on the transparent document table to generate image data.

The engine control unit 550 generates a control signal for controlling the printer unit 560 and the conveyance unit 580 based on the image data generated by the image scanner 540. A specific example of the engine control unit 550 includes a circuit board for generating a control signal based on image data.

The printer unit 560 serve as an image former that forms an image on the recording medium.

The printer unit 560 forms an image on the recording medium. The printer unit 560 includes a photoconductor drum 561 as a photoconductor, a charging device 562, a writing unit 563, a developing device 564, a conveyance belt 565, and a fixing device 566. The charging device 562 charges the outer surface of the photoconductor drum 561. The writing unit 563 exposes the charged photoconductor drum 561 based on the image data read by the image scanner 540, writing an electrostatic latent image on the photoconductor. The developing device 564 develops the written latent image with toner. The conveyance belt 565 conveys a recording medium on which a toner image is to be formed. The fixing device 566 fixes toner on the recording medium to the recording medium.

The sheet trays 570A and 570B contain recording media before image formation. In FIG. 9, two sheet trays are provided, each storing recording media having a different size. Alternatively, the number of the sheet trays may be one, or three or more.

The sheet conveyance unit 580 conveys a recording medium as a sheet conveyance unit. The sheet conveyance unit 580 includes various rollers. The sheet conveyance unit 580 includes various types of rollers and transports the recording media contained in the sheet trays 570A and 570B to the printer unit 560 in a direction indicated by arrow 500C.

A description is given of a flow of image formation, for example, in a copy mode of the image forming apparatus 500.

A user operates a function switching key in the control panel 510, sequentially switches between, for example, the copy function, the print function, and the facsimile function of the image forming apparatus 500, and selects the function to operate. The user selects the copy function to set the image forming apparatus 500 in the copy mode, selects the print function to set the image forming apparatus 500 in a printer mode, and selects the facsimile function to set the image forming apparatus 500 in a facsimile mode.

In the copy mode, the image scanner 540 scans an image of each document to be copied and generates image data.

The charging device 562 uniformly charges the outer surface of the photoconductor drum 561 in the dark, after which the writing unit 563 irradiates the outer surface of the photoconductor drum 561 with a light beam indicated by arrow 500A in FIG. 9, forming an electrostatic latent image thereon. The developing device 564 develops (visualizes) the electrostatic latent image with toner. As a result, a toner image is formed on the photoconductor drum 561. The photoconductor drum 561 rotates in a direction indicated by arrow 500B in FIG. 9. The toner image is then transferred from the photoconductor drum 561 onto a recording medium on the conveyance belt 565. The fixing device 566 applies heat to the toner image on the recording medium to fuse toner and fixes the toner image on the recording medium. Then, the recording medium is ejected from the image forming apparatus 500.

Although the case where the printer unit 560 forms an image by a monochrome electrophotographic method has been described, the printer unit 560 may form an image by, for example, a color electrophotographic method or an inkjet method, and the image forming method is not limited thereto.

Further, the control panel 510 described above may be controlled by the controller 530, or the image forming apparatus 500 may include a control circuit other than the controller 530 for controlling the control panel 510. In this case, the control circuit of the controller 530 and the control circuit of the control panel 510 are communicably connected to each other, and the controller 530 controls the entire image forming apparatus 500 including the control panel 510.

Note that in the embodiments described above, the image forming apparatus is described as an MFP having at least two of copying, printing, scanning, and facsimile functions. Alternatively, the image forming apparatus may be, e.g., a copier, a printer, a scanner, or a facsimile machine.

The aspects of the present invention are as follows, for example.

Aspect 1

A drive voltage control device includes a first drive power source to supply a first drive voltage to a first driver and a second driver connected to the first driver in series; a second drive power source to supply a second drive voltage to the first driver and the second driver; a voltage dropper connected in parallel with the first driver and the second driver and on a drive voltage line between the first drive power source and the second drive power source; a first switching circuit, a second switching circuit, a third switching circuit, and a fourth switching circuit. The first switching circuit includes a first switching element between the first drive power source and the voltage dropper on the drive voltage line, and first circuitry configured to switch the first switching element between ON and OFF. The second switching circuit includes a second switching element between the second drive power source and the voltage dropper on the drive voltage line; and second circuitry configured to switch the second switching element between ON and OFF. The third switching circuit includes a third switching element between the first drive power source and the first driver; and third circuitry configured to switch the third switching element between ON and OFF. The fourth switching circuit includes a fourth switching element between the first drive power source and the second driver; and fourth circuitry configured to switch the fourth switching element between ON and OFF.

Aspect 2

In the drive voltage control device according to Aspect 1, the first circuitry, the second circuitry, the third circuitry, and the fourth circuitry respectively switch the first switching element, the second switching element, the third switching element, and the fourth switching element between ON and OFF according to multiple patterns of ON and OFF combinations of the first switching element, the second switching element, the third switching element, and the fourth switching element, to supply one of multiple voltages including the first drive voltage and the second drive voltage to the first driver and the second driver.

Aspect 3

In the drive voltage control device according to Aspect 1 or 2, the first circuitry, the second circuitry, the third circuitry, and the fourth circuitry respectively control the first switching element, the second switching element, the third switching element, and the fourth switching element to stagger timing of switching between ON and OFF with respect to each other.

Aspect 4

In the drive voltage control device according to any one of Aspects 1 to 3, the first switching element, the second switching element, the third switching element, and the fourth switching element respectively include: field-effect transistors; and resistors between gates and sources of the field-effect transistors.

Aspect 5

In the drive voltage control device according to Aspect 4, the first switching circuit, the second switching circuit, the third switching circuit, and the fourth switching circuit include capacitors in parallel with the resistances, respectively.

Aspect 6

A drive voltage control circuit coupled to a fan motor comprising the drive voltage control device according to any one of Aspects 1 to 5.

Aspect 7

An image forming apparatus comprising the drive voltage control circuit according to any one of Aspects 1 to 5.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

Any one of the above-described operations may be performed in various other ways, for example, in an order different from the one described above.

Each of the functions of the described embodiments may be implemented by one or more processing circuits or circuitry. Processing circuitry includes a programmed processor, as a processor includes circuitry. A processing circuit also includes devices such as an application-specific integrated circuit (ASIC), a digital signal processor (DSP), a field programmable gate array (FPGA), and conventional circuit components arranged to perform the recited functions.

The invention claimed is:

1. A drive voltage control device comprising:
   a first drive power source to supply a first drive voltage to a first driver and a second driver connected to the first driver in series;
   a second drive power source to supply a second drive voltage to the first driver and the second driver;
   circuitry configured to drop voltage connected in parallel with the first driver and the second driver and on a drive voltage line between the first drive power source and the second drive power source;
   a first switching circuit including:
      a first switching element between the first drive power source and the circuitry configured to drop voltage on the drive voltage line; and
      first circuitry configured to switch the first switching element between ON and OFF;
   a second switching circuit including:
      a second switching element between the second drive power source and the circuitry configured to drop voltage on the drive voltage line; and
      second circuitry configured to switch the second switching element between ON and OFF;
   a third switching circuit including:
      a third switching element between the first drive power source and the first driver; and
      third circuitry configured to switch the third switching element between ON and OFF; and
   a fourth switching circuit including:
      a fourth switching element between the first driver and the second driver; and
      fourth circuitry configured to switch the fourth switching element between ON and OFF.

2. The drive voltage control device according to claim 1, wherein the first circuitry, the second circuitry, the third circuitry, and the fourth circuitry respectively switch the first switching element, the second switching element, the third switching element, and the fourth switching element between ON and OFF according to multiple patterns of ON and OFF combinations of the first switching element, the second switching element, the third switching element, and the fourth switching element, to supply one of multiple voltages including the first drive voltage and the second drive voltage to the first driver and the second driver.

3. The drive voltage control device according to claim 1, wherein the first circuitry, the second circuitry, the third circuitry, and the fourth circuitry respectively control the first switching element, the second switching element, the third switching element, and the fourth switching element to stagger timing of switching between ON and OFF with respect to each other.

4. The drive voltage control device according to claim 1, wherein the first switching element, the second switching element, the third switching element, and the fourth switching element respectively include:

field-effect transistors; and resistors between gates and sources of the field-effect transistors.

5. The drive voltage control device according to claim 4, wherein the first switching circuit, the second switching circuit, the third switching circuit, and the fourth switching circuit include capacitors in parallel with the resistors, respectively.

6. A drive voltage control circuit coupled to a fan motor comprising the drive voltage control device according to claim 1.

7. An image forming apparatus comprising the drive voltage control circuit according to claim 6.

* * * * *